United States Patent
Mei et al.

(10) Patent No.: US 9,634,635 B2
(45) Date of Patent: Apr. 25, 2017

(54) RF ATTENUATOR DEVICE AND SYSTEM

(71) Applicant: Anaren, Inc., East Syracuse, NY (US)

(72) Inventors: Chong Mei, Jamesville, NY (US); Bo Jensen, Minoa, NY (US)

(73) Assignee: ANAREN, INC., East Syracuse, NY (US)

( * ) Notice: Subject to any disclaimer, the term of this patent is extended or adjusted under 35 U.S.C. 154(b) by 78 days.

(21) Appl. No.: 14/836,079

(22) Filed: Aug. 26, 2015

(65) Prior Publication Data

US 2017/0019084 A1    Jan. 19, 2017

Related U.S. Application Data

(60) Provisional application No. 62/191,852, filed on Jul. 13, 2015.

(51) Int. Cl.
*H01Q 1/50* (2006.01)
*H03H 7/25* (2006.01)

(52) U.S. Cl.
CPC ............... *H03H 7/25* (2013.01); *H01Q 1/50* (2013.01)

(58) Field of Classification Search
None
See application file for complete search history.

(56) References Cited

U.S. PATENT DOCUMENTS

| | | | | |
|---|---|---|---|---|
| 6,271,727 | B1* | 8/2001 | Schmukler | H03G 1/0058 330/284 |
| 7,199,664 | B2* | 4/2007 | Bult | H01F 17/0006 257/E27.046 |
| 7,423,594 | B2* | 9/2008 | Yanagi | H01P 1/203 343/700 MS |
| 2001/0041548 | A1* | 11/2001 | Bult | H03F 3/195 455/252.1 |
| 2009/0021331 | A1* | 1/2009 | Hwang | H03H 7/25 333/81 R |
| 2011/0298569 | A1* | 12/2011 | Tzuang | H01P 1/20345 333/81 R |
| 2013/0027273 | A1* | 1/2013 | Kuwajima | H01P 5/18 343/850 |

* cited by examiner

*Primary Examiner* — Trinh Dinh
(74) *Attorney, Agent, or Firm* — David L. Nocilly; Bond, Schoeneck & King, PLLC

(57) ABSTRACT

A device includes a thermally conductive and electrically insulative substrate having a first major surface and a second major surface. A coupling structure is configured to reduce the RF input signal by substantially a predetermined amount of attenuation power. A tuning circuit is characterized by a tuning reactance substantially matched to a predetermined system impedance. A resistor is disposed on a majority of the first major surface and is characterized by a parasitic capacitance that is substantially negated by the tuning reactance. The resistor includes a first resistive portion and a second resistive portion; each of the first resistive portion and the second resistive portion being configured to direct approximately one-half of the attenuation power to the ground portion.

37 Claims, 4 Drawing Sheets

RF ATTENUATOR DEVICE AND SYSTEM

BACKGROUND OF THE INVENTION

1. Field of the Invention

The present invention relates generally to electrical devices and systems, and particularly to RF attenuators, devices and systems.

2. Technical Background

An RF attenuator is a device that is configured to reduce the level of an RF signal. Attenuation is typically measured as a ratio of the output power level over the input power level, and is thus given in decibels (dB). Because the power of the output signal is lower than the power of the input signal, the attenuation level is negative (e.g., −20 dB). As those of ordinary skill in the art will appreciate, attenuation is often required to protect a component or a circuit stage, e.g., monitoring or sampling circuitry, when an RF signal exceeds the power handling capabilities of the protected circuit. Thus, in many cases, the accuracy of the attenuator is important, because of the tolerances of the various stages of the overall RF design.

RF attenuators reduce the RF signal level by dissipating ($I^2R$ losses) excess power. As those of ordinary skill in the art will appreciate, power dissipation by $I^2R$ losses refers to a process whereby the RF energy is converted into thermal energy. When the RF signal is relatively small, for example, the heat generated by this process may not be an issue. On the other hand, when the RF signal power is relatively high, the RF attenuator must be configured so that the thermal energy is successfully directed from the attenuator to a heat exchange device and out of the RF system. Otherwise, the system components can overheat and become damaged. Power handling capabilities for RF attenuators are typically given in Watts (W), milliwatts (mW), dBW (decibels relative to a Watt), or in dBm (decibels relative to a milliwatt).

Attenuators are typically designed for use in systems that have a certain or predetermined characteristic impedance (that is typically established by the system designer per a customer's requirements). For example, an RF attenuator may be designed for use in a system that has a 50 Ohm (Ω) or a 75Ω characteristic impedance. Obviously, RF attenuators may be designed to operate in RF systems that are characterized by other impedance values. In any event, RF attenuators may be employed in such systems for impedance matching functions (in addition to the attenuation function). Those of ordinary skill in the art will also appreciate that the level of attenuation provided by an RF attenuator may vary as a function of frequency. The reason for the frequency dependence may relate to the use or existence of reactive components (e.g., inductors, capacitors) as well as a frequency dependence exhibited by the resistors employed in the RF attenuator.

In general, an RF attenuator is a type of RF component that may be used in a wide variety of applications wherein an RF input signal must be reduced to a required signal level. As noted above, an RF attenuator may be used for other applications such as impedance matching (in addition to attenuation).

Referring to FIG. 1, a schematic diagram of a conventional π-attenuator is shown. A π-attenuator is so named because it is formed in the shape of the Greek letter "π"; thus, it has one series resistor (R2) and two parallel resistors (R1, R3) shunted to ground. Specifically, resistor R1 is disposed at the input and resistor R3 is disposed the output, with resistor R2 disposed therebetween. The π-attenuator depicted in FIG. 1 implements a 20 dB attenuator that is characterized by a 50 Ohm port impedance. The parallel resistors R1 and R3 are equal to 61.11Ω, and the series resistor R2 is equal to 247.5Ω. If the conventional attenuator of FIG. 1 is configured to handle relatively high power, then the resistors R1, R2, and R3 can be implemented using thick film technology. Specifically, the resistors may be implemented by depositing a resistive paste on a ceramic substrate. The paste is typically a Nichrome (NiCr) formulation. The substrate can be any suitable substrate such as Alumina, Aluminum Nitride or BeO.

(The present invention should not be construed as being limited to any particular type of attenuator such as a π-attenuator, T-attenuator, etc.).

FIG. 2 is a parasitic capacitance model of the conventional π-attenuator depicted in FIG. 1. Briefly referring to FIG. 3, a plan view of a conventional π-attenuator shown in FIG. 2 is provided. Note that each resistor is configured to have a rectangular layout of length L and width W. The sheet resistance (Rs) value for a resistor is given by the expression R=Rs*L/W. The power handling capabilities of each resistor is proportional to its area L*W. The desired resistance can be realized by a resistor different area just as long as the equality Rs*L/W is maintained. Thus, given two resistors having the same sheet resistance (Rs), the larger resistor can handle more power. On the other hand, when an attenuator device features relative large resistive film regions, the resistive sheets are characterized by large parasitic capacitances that limit the RF bandwidth. As a result, many designs include one or more auxiliary tuning components that are used to reduce or obviate the effects of the parasitic capacitance.

Referring to FIG. 2, a parasitic capacitance model of the conventional π-attenuator depicted in FIG. 1 is shown. As noted above, each resistive sheet is characterized by a parasitic capacitance that can limit the RF bandwidth. Thus, each resistor (R1, R2 and R3) has a parasitic capacitor associated with it. Moreover, the model of FIG. 2 can be used to improve high frequency performance. For example, the series resistor R2 is shown herein as being implemented by two resistors R2' and R2" with an inductive high impedance transmission TL disposed therebetween. Putting it all together, the model shows that a parasitic capacitance Cp1 is associated with the input shunt resistor R1, a parasitic capacitance Cp3 is associated with the output shunt resistor R3, and parasitic capacitances Cp2' and Cp2" are associated with series resistors R2' and R2", respectively. As expected, therefore, the inductive transmission line TL is configured to cancel out the effects of parasitic capacitors Cp1, Cp2', Cp2" and Cp3.

Referring back to FIG. 3, a plan view of a conventional π-attenuator 1 that accounts for the parasitic capacitance modeled in FIG. 2 is provided. In this example, a 30 Watt 20 dB termination is shown. The attenuator 1 is implemented on a 0.1"×0.2"×25 mil aluminum nitride substrate where the resistor films R1, R2', R2" and R3 are made of Nichrome film. The input port, the output port, the tuning transmission line TL and the signal paths therebetween are implemented by providing metalized layers (see oblique shaded regions). The ground portions are also implemented by metalized layers. The metalized layers may be implemented by using a silver paste material Resistor R1 is 0.13×0.005 square inches and has a sheet resistance (Rs) of 159 Ohm/square. Resistors R2' and R2" are each 0.025×0.012 square inches and have a sheet resistance (Rs) of 59 Ohm/square. Resistor R3 is 0.025×0.012 square inches and has a sheet resistance (Rs) of 29 Ohm/square. As shown, the resistor R1 is disposed over a large portion of the layout area in order to efficiently direct the thermal energy (from I²R heat loss) into the ceramic substrate. Despite this, the thermal energy is not evenly distributed over the ceramic substrate; in fact, the hottest spots are in the area of resistors R2' and R2". Specifically, the percentage of the power dissipated by resistors R1, R2', R2", and R3 are P1=82%, P2'=8%, P2"=8% and P3=2%, respectively. Ideally, therefore, the portion of the overall surface area of the ceramic substrate occupied by the resistors R1, R2', R2", and R3 should be equal to about A1=82%, A2'=8%, A2"=8% and A3=2%, respectively, in order to evenly distribute the heat over the entire substrate and to maximize the power handling capabilities of device 10. Of course, since the attenuator 1 includes tuning circuitry such as transmission line TL, connecting lines and other layout constrains, the ideal condition cannot be perfectly satisfied. Thus, the ratio of the power dissipation percentage over the surface area for each resistor (i.e., P1/A1, P2'/A2', P2"/A2", P3/A3) is given by 2.5, 5.3, 5.3 and 1.3 respectively.

It is also worth noting that due to manufacturing tolerances, the resistance values are also often not in the design range. When that happens, a laser trimming process is required to modify the resistor geometry for each resistor deviation. Such laser trimming process adds time and, therefore, cost to the production process.

What is needed therefore is a different and simplified approach to manufacturing RF attenuator devices. To be specific, what is further needed is a simple attenuator circuit layout that substantially eliminates, or significantly reduces, the need to balance heat distribution between multiple resistors. While solving the heat distribution issue, an attenuator device should be configured to absorb the effects of parasitic capacitance in order to achieve a wideband return loss. What is also needed is a substantially optimized resistive patch arrangement that covers the maximum possible substrate surface area without degrading the input return loss; in other words, a device is needed that maximizes the device's power handling capabilities without sacrificing bandwidth. Finally, a device layout is needed that reduces the amount of laser trimming required to speed up the production process.

SUMMARY OF THE INVENTION

The present invention addresses the needs described above by providing a different and simplified approach to manufacturing RF attenuator devices. The present invention features a simple attenuator circuit layout that substantially eliminates, or significantly reduces, the need to balance heat distribution between multiple resistors. Specifically, one embodiment of the attenuator circuit features a single resistor that substantially maximizes the resistive patch arrangement; i.e., it covers the maximum possible substrate surface area without degrading the input return loss. Thus, the present invention maximizes the device's power handling capabilities without sacrificing bandwidth. While solving the heat distribution issue, the present invention is configured to absorb the effects of parasitic capacitance and thus achieves a wideband return loss. Because the device layout features a single (bifurcated) resistor, it reduces the amount of laser trimming required to speed up the production process.

One aspect of the present invention is directed to a device is directed to an RF attenuator device that includes an RF input port and an RF output port. A substrate has a first major surface and a second major surface, the substrate being thermally conductive and electrically insulative, the substrate including a ground portion disposed on at least the second major surface. A coupling structure is disposed on the substrate, the RF input port being configured to direct an RF input signal to the coupling structure, the coupling structure being configured to couple a predetermined coupled portion of the RF input signal within a predetermined frequency band to provide an RF output signal to the RF output port. A resistor is disposed on at least a majority of the first major surface and coupled between the tuning circuit and the ground portion, the resistor being configured to substantially direct an uncoupled portion of the RF input signal to the ground portion. A connective circuit is coupled between the coupling structure and the resistor, the connective circuit being configured to substantially direct the attenuation power to the resistor.

In one embodiment of the invention, the connective circuit includes a tuning circuit disposed on the substrate and coupled to the coupling structure, the tuning circuit being characterized by a tuning reactance, and wherein the resistor is characterized by a parasitic capacitance that is substantially negated by the tuning reactance.

In one version of the embodiment, the tuning reactance substantially matches the device to a predetermined system impedance.

In one version of the embodiment, the tuning circuit includes an inductive component coupled to a capacitive component, the inductive tuning component and the capacitive tuning component having an inductance and capacitance, respectively, the inductance and capacitance being selected in accordance with the predetermined frequency band, the system impedance or the predetermined amount of attenuation power.

In one version of the embodiment, the inductive tuning component is disposed between the resistor and the capacitive tuning component.

In one version of the embodiment, the resistor and the capacitive tuning component are shunted to ground.

In one version of the embodiment, the inductive tuning component includes a high impedance transmission line that substantially bisects the resistor component so that the first resistive portion and the second resistive portion occupy a substantially equal amount of surface area.

In one embodiment of the invention, the resistor includes a first resistive portion and a second resistive portion, each of the first resistive portion and the second resistive portion being configured to direct approximately one-half of the attenuation power to the ground portion.

In one embodiment of the invention, the coupling structure substantially rejects DC signal components propagating in the RF input signal.

In one embodiment of the invention, the coupling structure is selected from a group of coupling structures that includes a capacitive component, an RF coupler component, an inductive component, and a transmission line component.

In one embodiment of the invention, the substrate is a material selected from a group of ceramic materials including an Alumina material, an Aluminum Nitride material, BeO material or chemical vapor deposition (CVD) diamond material.

In one embodiment of the invention, the resistor is comprised of a Nichrome, Tantalum Nitride, Ruthenium oxides, or other film composition.

In one embodiment of the invention, the coupling structure, the ground portion and at least a portion of the tuning circuit are comprised of at least one metallization layer formed on at least the first major surface or the second major surface, the at least one metallization layer being comprised of at least one composition selected from a group of compositions that include silver, nickel, molybdenum, tungsten, iron, gold or copper.

In one embodiment of the invention, the RF attenuator device is configured as a surface mount device.

Another aspect of the present invention is directed to an RF system that includes an RF signal source configured to provide an RF input signal. An antenna assembly is coupled to the RF signal source, the antenna assembly being configured to direct a radiated RF signal into an ambient environment, the radiated RF signal being based on the RF input signal. An RF attenuator device includes an attenuator input port and an attenuator output port, the attenuator input port being configured to receive an RF signal sample from the antenna assembly, the RF signal sample being based on the radiated RF signal. The RF attenuator device further includes a substrate having a first major surface and a second major surface, the substrate being thermally conductive and electrically insulative, the substrate including a ground portion disposed on at least the second major surface. The device further includes an coupling structure disposed on the substrate and coupled to the attenuator input port, the coupling structure being configured to couple a predetermined coupled portion of the RF signal sample within a predetermined frequency band to provide an attenuated RF signal sample to the attenuator output port. The device also includes a resistor disposed on at least a majority of the first major surface and coupled between the tuning circuit and the ground portion, the resistor being configured to substantially direct an uncoupled portion of the RF input signal to the ground portion. The device further includes a connective circuit coupled between the coupling structure and the resistor, the connective circuit being configured to substantially direct the attenuation power to the resistor. A signal monitor portion is coupled to the attenuator output port, the signal monitor portion being configured to derive at least one signal characteristic from the attenuated RF signal sample.

In one embodiment of the invention, the signal monitor is configured to determine an operational status of the antenna assembly.

In one embodiment of the invention, the at least one signal characteristic is an impedance characteristic, the signal monitor being configured to indicate an antenna assembly malfunction if the impedance characteristic corresponds to an impedance mismatch condition.

In one embodiment of the invention, the antenna assembly includes an antenna coupled to an RF circulator, the RF circulator being further coupled between the RF signal source and the attenuator input port.

In one embodiment of the invention, the RF signal source is disposed in a transmitter portion of the RF system, and wherein the transmitter portion includes an RF directional coupler coupled between an RF power amplifier and the antenna assembly, the RF directional coupler being configured to provide a forward sampled signal based on the RF input signal, the forward sampled signal being indicative of an operational status of the RF power amplifier.

In one embodiment of the invention, the connective circuit includes a tuning circuit disposed on the substrate and coupled to the coupling structure, the tuning circuit being characterized by a tuning reactance, and wherein the resistor is characterized by a parasitic capacitance that is substantially negated by the tuning reactance.

In one version of the embodiment, the tuning reactance is substantially matched to a predetermined system impedance.

In one version of the embodiment, the tuning circuit includes an inductive component coupled to a capacitive component, the inductive tuning component and the capacitive tuning component having an inductance and capacitance, respectively, the inductance and capacitance being selected in accordance with the predetermined frequency band, the system impedance or the predetermined amount of attenuation power.

In one version of the embodiment, the inductive tuning component is disposed between the resistor and the capacitive tuning component.

In one version of the embodiment, the inductive tuning component includes a high impedance transmission line that substantially bisects the resistor component so that the first resistive portion and the second resistive portion occupy a substantially equal amount of surface area.

In one embodiment of the invention, the resistor includes a first resistive portion and a second resistive portion, each of the first resistive portion and the second resistive portion being configured to direct approximately one-half of the attenuation power to the ground portion.

In one embodiment of the invention, the coupling structure is configured to substantially reject DC signal components propagating in the RF input signal.

In one embodiment of the invention, the coupling structure is selected from a group of coupling structures that includes a capacitive component, an RF coupler component, an inductive component, and a transmission line component.

In one embodiment of the invention, the RF attenuator device is configured as a surface mount device.

Yet another aspect of the present invention is directed to an RF attenuator device that includes an RF input port and an RF output port. A substrate has a first major surface and a second major surface, the substrate being thermally conductive and electrically insulative, the substrate including a ground portion disposed on at least the second major surface. A coupling structure is disposed on the substrate, the RF input port being configured to direct an RF input signal to the coupling structure, the coupling structure being configured to couple a predetermined coupled portion of the RF input signal within a predetermined frequency band to provide an RF output signal to the RF output port. A tuning circuit is disposed on the substrate and coupled to the coupling structure, the tuning circuit being characterized by a tuning reactance substantially matching the attenuator device to a predetermined system impedance. A resistor is disposed on at least a majority of the first major surface and coupled between the tuning circuit and the ground portion, the resistor being characterized by a parasitic capacitance that is substantially negated by the tuning reactance, the resistor including a first resistive portion and a second resistive portion, each of the first resistive portion and the second resistive portion being configured to direct approximately one-half of an uncoupled portion of the RF input signal to the ground portion.

In one embodiment of the invention, the tuning circuit includes an inductive component coupled to a capacitive component, the inductive tuning component and the capacitive tuning component having an inductance and capacitance, respectively, the inductance and capacitance being selected in accordance with the predetermined frequency band, the system impedance or the predetermined amount.

In one version of the embodiment, the inductive tuning component is disposed between the resistor and the capacitive tuning component.

In one version of the embodiment, the resistor and the capacitive tuning component are shunted to ground.

In one version of the embodiment, the inductive tuning component includes a high impedance transmission line disposed between the first resistive portion and the second resistive portion so that the first resistive portion and the second resistive portion occupy a substantially equal amount of surface area.

In one embodiment of the invention, the first resistive portion and the second resistive portion are comprised of a Nichrome, Tantalum Nitride, Ruthenium oxides, or other film composition.

In one embodiment of the invention, the coupling structure, the ground portion and at least a portion of the tuning circuit are comprised of at least one metallization layer formed on at least the first major surface or the second major surface, and wherein the at least one metallization layer is comprised of at least one composition selected from a group of compositions that include silver, nickel, molybdenum, tungsten, iron, gold or copper.

In one embodiment of the invention, the substrate is a material selected from a group of ceramic materials including an Alumina material, an Aluminum Nitride material, BeO material or chemical vapor deposition (CVD) diamond material.

In one embodiment of the invention, the coupling structure is selected from a group of coupling structures that includes a capacitive component, an RF coupler component, an inductive component, and a transmission line component.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

The accompanying drawings are included to provide a further understanding of the invention, and are incorporated in and constitute a part of this specification. The drawings illustrate various embodiments of the invention and together with the description serve to explain the principles and operation of the invention.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

Figure 1:
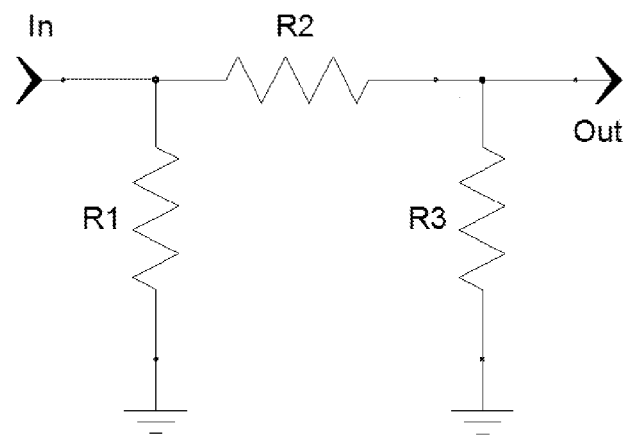
FIG. 1 is a schematic diagram of a conventional π-attenuator.
Figure 2:
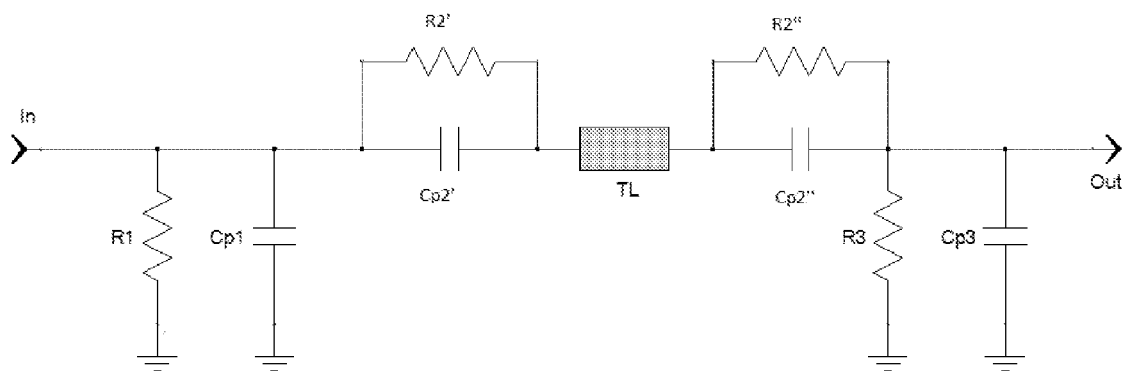
FIG. 2 is a parasitic capacitance model of the conventional π-attenuator depicted in FIG. 1.
Figure 3:
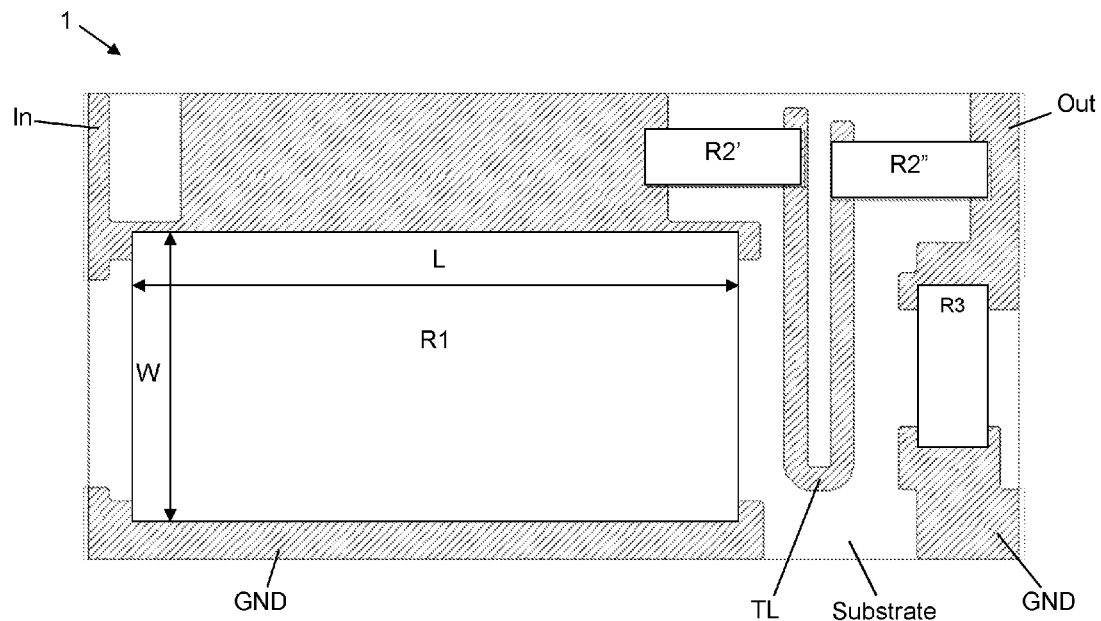
FIG. 3 is a plan view of a conventional π-attenuator that accounts for the parasitic capacitance modeled in FIG. 2.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the attenuator of the present invention is shown in FIG. 4, and is designated generally throughout by reference numeral 10.

Figure 4:
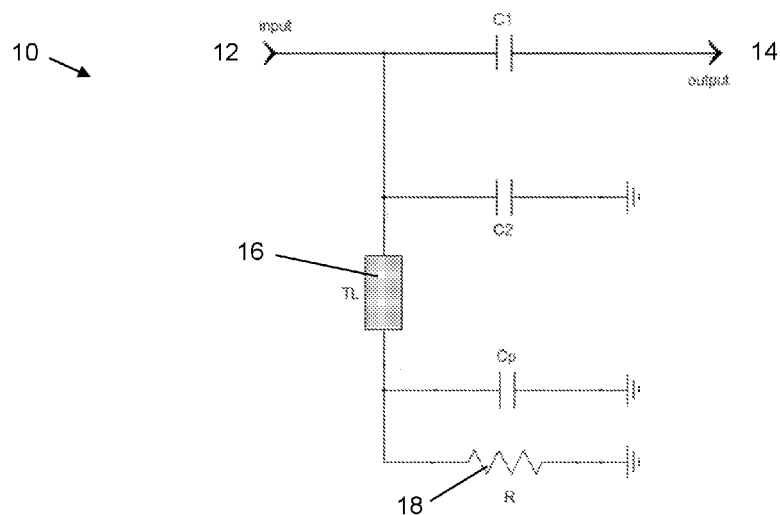
FIG. 4 is a schematic view of an RF attenuator in accordance with an embodiment of the present invention.

As embodied herein, and depicted in FIG. 4, a schematic view of an RF attenuator in accordance with an embodiment of the present invention is disclosed. In the schematic view of FIG. 4, a relatively small capacitor C1 is disposed between the input port 12 and the output port 14. Capacitor C1 is configured to couple a portion of the AC signal energy from the input port to output port. (Of course, capacitor C1 blocks DC signals). The input port 12 is also coupled to tuning capacitor C2 and inductive transmission line 16. The transmission line 16 is further connected to a resistor 18 that is shunted to ground. In other words, the resistor 18 is configured to direct the $I^2R$ heat losses to ground where they can be dissipated. A parasitical capacitor Cp is shown in parallel with the resistor 18. The purpose of the capacitor C2 and the transmission line 16 is to form a reactance that absorbs the parasitical capacitance Cp. As those skilled in the art will appreciate the exact value of the capacitor C2 and the transmission line 16 depends on a variety of factors such as system impedance, the frequency band of operation, power handling requirements, desired attenuation level, etc.

As those of ordinary skill in the art will appreciate, the coupling structure C1 may be implemented using any suitable coupling element. In each implementation, the coupling structure C1 is configured to couple a predetermined amount of the RF input signal energy (based on the desired or selected attenuation amount) to the output port 14. In one embodiment, the coupling structure C1 is realized by a capacitor. In another example, the coupling element C1 may be implemented using an RF coupler device. Moreover, the RF coupler need not be implemented by a full scale commercial four port coupler component (e.g., of the type that Anaren Inc. typically sells on the market); instead, the system designers may provide a coupler structure that merely provides the coupled signal to the output and the uncoupled portion to the resistor 18 in order to provide a more compact attenuator device 10. (If the designers choose to employ a full scale coupler component, then the overall size of the RF attenuator 10 can be larger). The coupling structure C1 can also be implemented using a high impedance line or by an inductor tapped directly, or indirectly, on the path to the resistor. Essentially, any type of device or component that is configured to divert the desired amount of the RF input signal energy toward the output port can be employed herein. The resistor 18 will convert the uncoupled portion of the RF input signal into thermal energy that is dissipated via the ground plane and any additional heat exchanging elements coupled thereto.

Figure 5A:
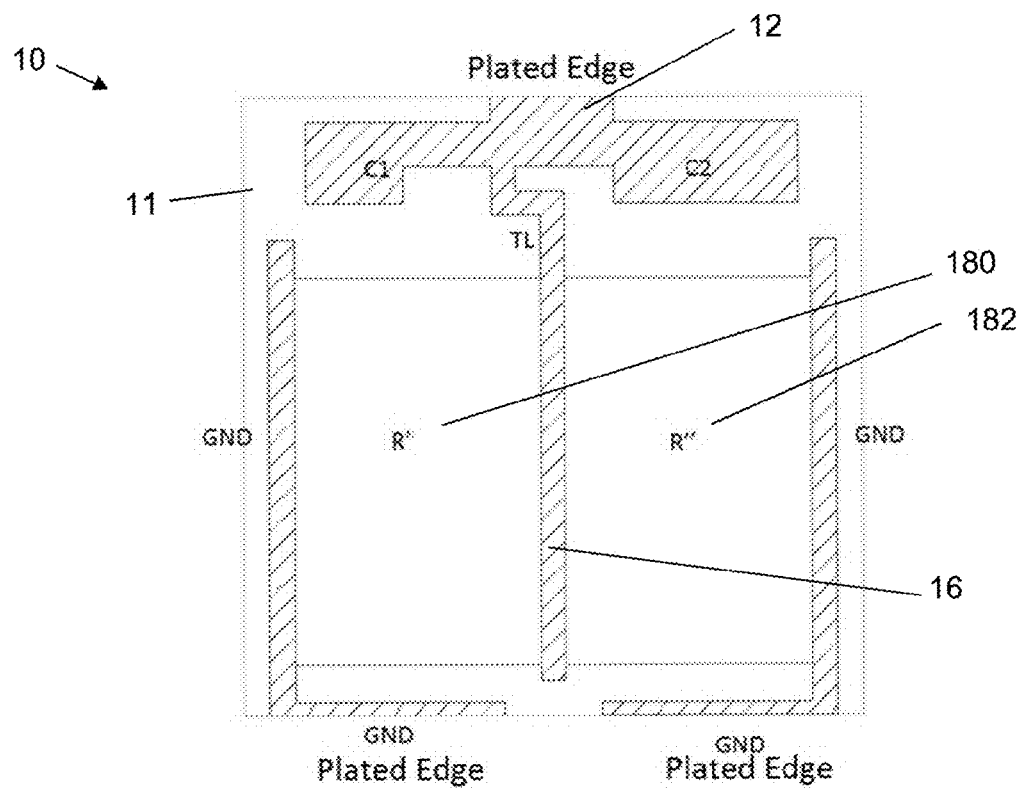
FIGS. 5A-5B are top and bottom plan views of an implementation of the RF attenuator depicted in FIG. 4.
Figure 5B:
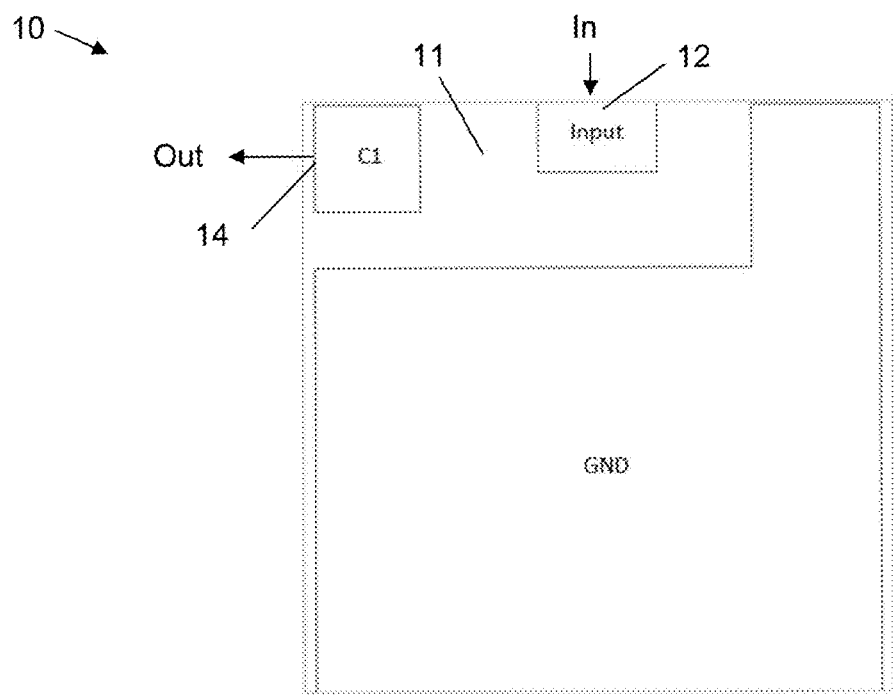

Referring to FIGS. 5A-5B, top and bottom plan views of an implementation of the RF attenuator depicted in FIG. 4 is disclosed. In this example, the attenuator 10 is configured for use in a system that is characterized by a 50 Ohm system impedance and a 1.8-2.2 GHz frequency band (a popular communication frequency band). The desired power handling capability of device 10 is about 150 W. If 30 dB attenuation is desired, the capacitance of capacitor C1 is approximately equal to 0.05 pF. (If 20 dB attenuation is desired, the capacitance of capacitor C1 is approximately equal to 0.16 pF). Assuming that the resistance of resistor 18 is about 49 Ohms and the parasitic capacitance (Cp) is about 0.1 pF, these elements can be matched to the 50 Ohm system impedance (in the working band) by a C2 capacitance of 0.1 pF and an inductance (i.e., inductor 16) implemented by transmission line of 8° at 2 GHz and 100 Ohm characteristic impedance.

Thus, the tuning circuit (e.g., capacitor C2 and transmission line 16) is a connective circuit configured to direct the attenuated signal power (not passed to the RF output port) to the resistor by an appropriate selection of the tuning reactance (tuning inductance and capacitance values). In low frequency embodiments of the invention, the connective circuit can be configured without the matching reactance in mind; however, this type of configuration could result in reflections propagating on the connective circuit.

In the top and bottom views of FIGS. 5A-5B, the above described design is implemented using a surface mount substrate 11. (Again, the device 10 is a 150 W device that provides 30 dB attenuation). It will be apparent to those of ordinary skill in the pertinent art that modifications and variations can be made to substrate 11 of the present invention depending on the required material properties, for example, substrate 11 must be both thermally conductive and electrically insulative). For example, in one embodiment substrate 11 may be implemented using a 25 mil thick Aluminum Nitride substrate having a 0.25"×0.25" surface area. (Those skilled in the art will appreciate that Aluminum Nitride may have a thermal conductivity of up to 200 W/mK or more). Those skilled in the art will appreciate that any suitable substrate may be employed herein (e.g., Alumina, Aluminum Nitride or BeO).

The input port 12 is formed by the metalized portion between capacitors C1 and C2, per the schematic of FIG. 4. One plate of C1 is implemented on the top of the substrate (FIG. 5A) and the opposing capacitor plate is formed on the bottom side of the substrate 11 (FIG. 5B). The opposing capacitor plate of C1 also serves as the soldering pad for the output port. Similarly, one plate of C2 is implemented on the top of the substrate (FIG. 5A) and the opposing capacitor plate is formed by the ground plate disposed on the bottom side of the device (FIG. 5B). It will be apparent to those of ordinary skill in the pertinent art that modifications and variations can be made to the metallized regions formed on the various surfaces of the substrate 11; for example, the metallized portions may be implemented using any suitable conductive composition that includes silver, nickel, molybdenum, tungsten, iron, gold, or copper. Thus, in one embodiment of the present invention, the metalized portions are implemented using a silver paste material.

Referring to FIG. 5A, the resistor 18 (in FIG. 4) is divided into two resistors 180 and 182 disposed in parallel; each is 100 Ohms and terminated to bottom ground pad through the plated edge. It will be apparent to those of ordinary skill in the pertinent art that modifications and variations can be made to the resistive regions formed on the various surfaces of the substrate 11; for example, the resistive portions 180, 182 may be implemented using any suitable material such as Nichrome, Tantalum Nitride, Ruthenium oxides, etc. In one embodiment the resistors 180 and 182 are made of a Nichrome paste having a sheet resistance (Rs) of about 159 Ohms Each resistor has a 0.1"×0.167" surface area so that each resistor (180, 182) dissipates half of the power. The ratio of the power dissipation percentage over the surface area for each resistor is again given by P/R; in this case, the ratio of P/R for both resistor 180 and resistor 182 equals approximately 1.8. (Each resistor (R' or R") dissipates approximately 50% of the total input power and each resistor film occupies over 28% of the total surface area, making P/A≈1.8.)

Note that the P/R value of the present invention is much lower than the values achieved in the conventional design (See Background). In other words, the heat distribution density of the present invention is lower than that of the conventional design, and the dissipated power of the present invention is more evenly distributed to entire area that that of the conventional design. In sum, the power handling and the stackup of the present invention is substantially optimized. Since the resistors (180, 182) are disposed in one location, any laser trimming that is required can be done efficiently.

Figure 6:
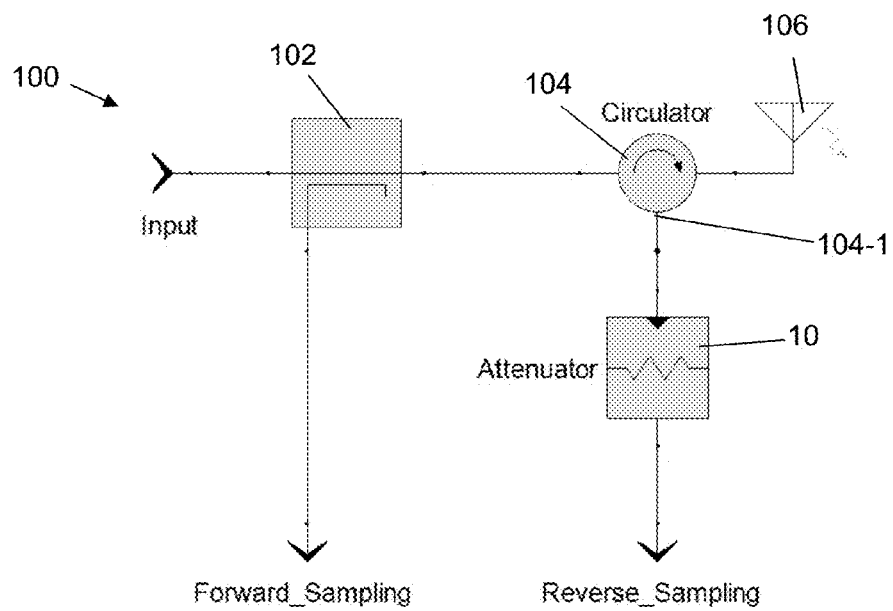
FIG. 6 is a schematic diagram of an RF signal monitor that includes the RF attenuator depicted in FIG. 4.

Referring to FIG. 6, a schematic diagram of an RF signal monitor 100 that includes the RF attenuator 10 depicted in FIG. 4 is disclosed. In a cellular base station, it is important to know if the antenna 106 is operating properly. Thus, the base station often includes a monitoring circuit 100 to determine if the antenna is functioning properly. In this case, the RF signal may be input from, e.g., a power amplifier. A directional coupler 102 samples the incident signal, and provides the sample to a forward sampling monitor. The remainder of the incident signal is provided to the antenna 106 via the circulator 104. If the antenna 106 is damaged or malfunctioning, the problem manifests itself as an impedance mismatch. Of course, any mismatch from the antenna 106 would cause a reflection to propagate on the transmission line between the circulator 104 and the antenna 106. The reflected wave is subsequently guided by the circulator 104 to its isolated port 104-1.

In the system 100, the attenuator 10 is coupled between the isolated port 104-1 of the circulator and a reverse sampling monitor. The majority of the signal energy provided by port 104-1 is dissipated by the attenuator 10 so that a small reverse sampled signal can be provided to the reverse sampling detection circuitry. The reverse sampling detection circuitry determines the magnitude of the reflection. Those skilled in the art will appreciate that the quality of the transmission path can be determined by comparing the reverse sampled signal and the forward sampled signal, since the forward sampled signal represents the signal provided by the coupler 102. The detection circuit is configured to provide a warning signal so that a protection action can be performed when the transmission quality is too poor. Again, the required attenuation for such applications can be any suitable amount (e.g., 20-30 dB).

Figure 7:
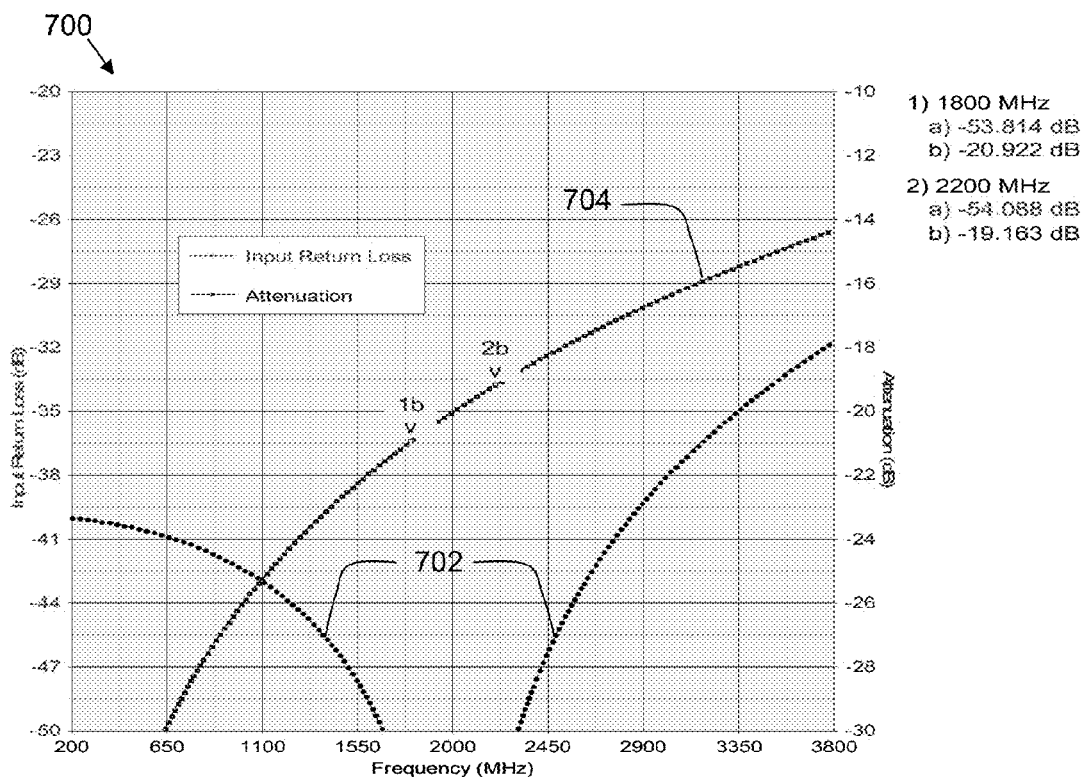
FIG. 7 is a chart illustrating the performance of the RF attenuator depicted in FIG. 4.

Referring to FIG. 7, a chart 700 illustrating the performance of the RF attenuator depicted in FIG. 4 is disclosed. In one embodiment of the present invention, the input return loss 702, in the frequency range between 1800-2200 MHz, is below −50 dB. As a result, device 10 may be employed over a wide frequency band. The attenuation curve 704 indicates that a 20 dB attenuation is achieved in the working band. As shown in the plot of FIG. 7, a better than −30 dB return loss can achieved up to 3.8 GHz. The wideband matching is achieved by the unique tuning design disclosed herein. Note also that the attenuation curve shown in FIG. 7 is not as flat over a wide frequency range; this is not problematic because a look-up table can be employed in the sampling application (e.g., the power sampling application of FIG. 6). This attenuator can be used in wider frequency band, say 650 MHz to 3.8 GHz, as long as the sampled reading can be corrected by lookup table.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. There is no intention to limit the invention to the specific form or forms disclosed, but on the contrary, the intention is to cover all modifications, alternative constructions, and equivalents falling within the spirit and scope of the invention, as defined in the appended claims. It is, therefore, to be understood that the foregoing embodiments are presented by way of example only and that, within the scope of the appended claims and equivalents thereto; inventive embodiments may be practiced otherwise than as specifically described and claimed.

All references, including publications, patent applications, and patents, cited herein are hereby incorporated by reference to the same extent as if each reference were individually and specifically indicated to be incorporated by reference and were set forth in its entirety herein.

All definitions, as defined and used herein, should be understood to control over dictionary definitions, definitions in documents incorporated by reference, and/or ordinary meanings of the defined terms.

The use of the terms "a" and "an" and "the" and similar referents in the context of describing the invention (especially in the context of the following claims) are to be construed to cover both the singular and the plural, unless otherwise indicated herein or clearly contradicted by context.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An RF attenuator device comprising:
   an RF input port and an RF output port;
   a substrate having a first major surface and a second major surface, the substrate being thermally conductive and electrically insulative, the substrate including a ground portion disposed on at least the second major surface;
   a coupling structure disposed on the substrate, the RF input port being configured to direct an RF input signal to the coupling structure, the coupling structure being configured to couple a predetermined coupled portion of the RF input signal within a predetermined frequency band to provide an RF output signal to the RF output port;
   a resistor disposed on at least a majority of the first major surface and coupled between a tuning circuit and the ground portion, the resistor being configured to substantially direct an uncoupled portion of the RF input signal to the ground portion; and a connective circuit coupled between the coupling structure and the resistor, the connective circuit being configured to substantially direct the attenuation power to the resistor.

2. The device of claim 1, wherein the tuning circuit is disposed on the substrate and coupled to the coupling structure, the tuning circuit being characterized by a tuning reactance, and wherein the resistor is characterized by a parasitic capacitance that is substantially negated by the tuning reactance.

3. The device of claim 2, wherein the tuning reactance substantially matches the device to a predetermined system impedance.

4. The device of claim 2, wherein the tuning circuit includes an inductive component coupled to a capacitive component, the inductive tuning component and the capacitive tuning component having an inductance and capacitance, respectively, the inductance and capacitance being selected in accordance with the predetermined frequency band, the system impedance or the predetermined amount of attenuation power.

5. The device of claim 4, wherein the inductive tuning component is disposed between the resistor and the capacitive tuning component.

6. The device of claim 4, wherein the resistor and the capacitive tuning component are shunted to ground.

7. The device of claim 4, wherein the inductive tuning component includes a high impedance transmission line that substantially bisects the resistor component so that the first resistive portion and the second resistive portion occupy a substantially equal amount of surface area.

8. The device of claim 1, wherein the resistor includes a first resistive portion and a second resistive portion, each of the first resistive portion and the second resistive portion being configured to direct approximately one-half of the attenuation power to the ground portion.

9. The device of claim 1, wherein the coupling structure substantially rejects DC signal components propagating in the RF input signal.

10. The device of claim 1, wherein the coupling structure is selected from a group of coupling structures that includes a capacitive component, an RF coupler component, an inductive component, and a transmission line component.

11. The device of claim 1, wherein the substrate is a material selected from a group of ceramic materials including an Alumina material, an Aluminum Nitride material, BeO material or chemical vapor deposition (CVD) diamond material.

12. The device of claim 1, wherein the resistor is comprised of a Nichrome, Tantalum Nitride, Ruthenium oxides, or other film composition.

13. The device of claim 1, wherein the coupling structure, the ground portion and at least a portion of the tuning circuit are comprised of at least one metallization layer formed on at least the first major surface or the second major surface, the at least one metallization layer being comprised of at least one composition selected from a group of compositions that include silver, nickel, molybdenum, tungsten, iron, gold or copper.

14. The device of claim 1, wherein the RF attenuator device is configured as a surface mount device.

15. An RF system comprising:
an RF signal source configured to provide an RF input signal;

an antenna assembly coupled to the RF signal source, the antenna assembly being configured to direct a radiated RF signal into an ambient environment, the radiated RF signal being based on the RF input signal;

an RF attenuator device including an attenuator input port and an attenuator output port, the attenuator input port being configured to receive an RF signal sample from the antenna assembly, the RF signal sample being based on the radiated RF signal, the RF attenuator device further including a substrate having a first major surface and a second major surface, the substrate being thermally conductive and electrically insulative, the substrate including a ground portion disposed on at least the second major surface, the device further including a coupling structure disposed on the substrate and coupled to the attenuator input port, the coupling structure being configured to couple a predetermined coupled portion of the RF signal sample within a predetermined frequency band to provide an attenuated RF signal sample to the attenuator output port, the device also including a resistor disposed on at least a majority of the first major surface and coupled between a tuning circuit and the ground portion, the resistor being configured to substantially direct an uncoupled portion of the RF input signal to the ground portion, the device further including a connective circuit coupled between the coupling structure and the resistor, the connective circuit being configured to substantially direct the attenuation power to the resistor; and a signal monitor portion coupled to the attenuator output port, the signal monitor portion being configured to derive at least one signal characteristic from the attenuated RF signal sample.

16. The system of claim 15, wherein the signal monitor is configured to determine an operational status of the antenna assembly.

17. The system of claim 15, wherein the at least one signal characteristic is an impedance characteristic, the signal monitor being configured to indicate an antenna assembly malfunction if the impedance characteristic corresponds to an impedance mismatch condition.

18. The system of claim 15, wherein the antenna assembly includes an antenna coupled to an RF circulator, the RF circulator being further coupled between the RF signal source and the attenuator input port.

19. The system of claim 15, wherein the RF signal source is disposed in a transmitter portion of the RF system, and wherein the transmitter portion includes an RF directional coupler coupled between an RF power amplifier and the antenna assembly, the RF directional coupler being configured to provide a forward sampled signal based on the RF input signal, the forward sampled signal being indicative of an operational status of the RF power amplifier.

20. The system of claim 15, wherein the tuning circuit is disposed on the substrate and coupled to the coupling structure, the tuning circuit being characterized by a tuning reactance, and wherein the resistor is characterized by a parasitic capacitance that is substantially negated by the tuning reactance.

21. The system of claim 20, wherein the tuning reactance is substantially matched to a predetermined system impedance.

22. The system of claim 20, wherein the tuning circuit includes an inductive component coupled to a capacitive component, the inductive tuning component and the capacitive tuning component having an inductance and capacitance, respectively, the inductance and capacitance being selected in accordance with the predetermined frequency band, the system impedance or the predetermined amount of attenuation power.

23. The system of claim 22, wherein the inductive tuning component is disposed between the resistor and the capacitive tuning component.

24. The system of claim 22, wherein the inductive tuning component includes a high impedance transmission line that substantially bisects the resistor component so that the first resistive portion and the second resistive portion occupy a substantially equal amount of surface area.

25. The system of claim 15, wherein the resistor includes a first resistive portion and a second resistive portion, each of the first resistive portion and the second resistive portion being configured to direct approximately one-half of the attenuation power to the ground portion.

26. The system of claim 15, wherein the coupling structure is configured to substantially reject DC signal components propagating in the RF input signal.

27. The system of claim 15, wherein the coupling structure is selected from a group of coupling structures that includes a capacitive component, an RF coupler component, an inductive component, and a transmission line component.

28. The system of claim 15, wherein the RF attenuator device is configured as a surface mount device.

29. An RF attenuator device comprising:
an RF input port and an RF output port;
a substrate having a first major surface and a second major surface, the substrate being thermally conductive and electrically insulative, the substrate including a ground portion disposed on at least the second major surface;
a coupling structure disposed on the substrate, the RF input port being configured to direct an RF input signal to the coupling structure, the coupling structure being configured to couple a predetermined coupled portion of the RF input signal within a predetermined frequency band to provide an RF output signal to the RF output port;
a tuning circuit disposed on the substrate and coupled to the coupling structure, the tuning circuit being characterized by a tuning reactance substantially matching the attenuator device to a predetermined system impedance;
a resistor disposed on at least a majority of the first major surface and coupled between the tuning circuit and the ground portion, the resistor being characterized by a parasitic capacitance that is substantially negated by the tuning reactance, the resistor including a first resistive portion and a second resistive portion, each of the first resistive portion and the second resistive portion being configured to direct approximately one-half of an uncoupled portion of the RF input signal to the ground portion.

30. The device of claim 29, wherein the tuning circuit includes an inductive component coupled to a capacitive component, the inductive tuning component and the capacitive tuning component having an inductance and capacitance, respectively, the inductance and capacitance being selected in accordance with the predetermined frequency band, the system impedance or the predetermined amount.

31. The device of claim 30, wherein the inductive tuning component is disposed between the resistor and the capacitive tuning component.

32. The device of claim 30, wherein the resistor and the capacitive tuning component are shunted to ground.

33. The device of claim 30, wherein the inductive tuning component includes a high impedance transmission line disposed between the first resistive portion and the second resistive portion so that the first resistive portion and the second resistive portion occupy a substantially equal amount of surface area.

34. The device of claim 29, wherein the first resistive portion and the second resistive portion are comprised of a Nichrome, Tantalum Nitride, Ruthenium oxides, or other film composition.

35. The device of claim 29, wherein the coupling structure, the ground portion and at least a portion of the tuning circuit are comprised of at least one metallization layer formed on at least the first major surface or the second major surface, and wherein the at least one metallization layer is comprised of at least one composition selected from a group of compositions that include silver, nickel, molybdenum, tungsten, iron, gold or copper.

36. The device of claim 29, wherein the substrate is a material selected from a group of ceramic materials including an Alumina material, an Aluminum Nitride material, BeO material or chemical vapor deposition (CVD) diamond material.

37. The device of claim 29, wherein the coupling structure is selected from a group of coupling structures that includes a capacitive component, an RF coupler component, an inductive component, and a transmission line component.

* * * * *